(12) United States Patent
Bernardon et al.

(10) Patent No.: US 6,987,403 B2
(45) Date of Patent: Jan. 17, 2006

(54) DRIVER FOR AN EXTERNAL FET WITH HIGH ACCURACY AND GATE VOLTAGE PROTECTION

(75) Inventors: Derek Bernardon, Villach (AT); Markus Müllauer, Friesach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/454,197

(22) Filed: Jun. 4, 2003

(65) Prior Publication Data

US 2003/0231048 A1  Dec. 18, 2003

Related U.S. Application Data

(63) Continuation of application No. PCT/EP01/14120, filed on Dec. 3, 2001.

(30) Foreign Application Priority Data

Dec. 4, 2000  (EP) .................................. 00126640

(51) Int. Cl.
*H03K 3/00* (2006.01)

(52) U.S. Cl. .................... 327/108; 327/538; 327/541

(58) Field of Classification Search .............. 327/108, 327/538, 541, 543; 326/82, 83, 85, 86, 87, 326/91, 66

See application file for complete search history.

(56) References Cited

U.S. PATENT DOCUMENTS

| | | | |
|---|---|---|---|
| 3,760,194 A | 9/1973 | Lutz et al. ..................... 327/52 |
| 4,626,795 A | 12/1986 | Tanaka et al. ............... 330/257 |
| 4,769,616 A * | 9/1988 | Barbu ......................... 330/252 |
| 4,797,583 A * | 1/1989 | Ueno et al. .................... 326/66 |
| 5,122,689 A | 6/1992 | Barre ........................... 326/73 |
| 5,214,328 A * | 5/1993 | Ohi .............................. 326/66 |
| 5,329,183 A * | 7/1994 | Tamegaya ..................... 326/66 |
| 5,568,092 A * | 10/1996 | Shimizu et al. .............. 330/260 |
| 5,731,686 A | 3/1998 | Malhi ......................... 320/154 |
| 5,774,021 A | 6/1998 | Szepesi et al. ............... 330/257 |
| 5,777,502 A | 7/1998 | Chen et al. .................. 327/309 |
| 5,963,025 A | 10/1999 | Colli ........................... 323/228 |
| 6,002,276 A | 12/1999 | Wu .............................. 327/66 |
| 6,275,107 B1 * | 8/2001 | Maeda et al. ................ 330/253 |
| 6,566,961 B2 * | 5/2003 | Dasgupta et al. ............ 330/301 |

FOREIGN PATENT DOCUMENTS

| | | |
|---|---|---|
| EP | 0 492 374 A1 | 7/1992 |
| EP | 0 669 709 A1 | 8/1995 |
| JP | 01093908 | 4/1989 |
| WO | 96/10287 | 4/1996 |
| WO | 98/20610 | 5/1998 |

OTHER PUBLICATIONS

Titze, U. et al.: "Halbleiter-Schaltungstechnik" [Semiconductor Circuit Technology], Springer Verlag, vol. 2, 1971, pp. 196-197.

Barbara, N.V. et al.: "Ionizing-Radiation-Induced Degradation in Electronic Power Amplifiers", IEEE, Oct. 7, 1990, pp. 1667-1672.

* cited by examiner

*Primary Examiner*—Tuan T. Lam
*Assistant Examiner*—Hiep Nguyen
(74) *Attorney, Agent, or Firm*—Laurence A. Greenberg; Werner H. Stemer; Ralph E. Locher

(57) ABSTRACT

A circuit for driving an external FET has a differential amplification stage supplied by a first and second operating potential. An output load resistor is included in a current flow path in which the current is controlled by the voltage between two input terminals of the amplification stage. The current is substantially independent of variations of the first or second operating potentials. The output load resistor is connected between the gate and the source of the external FET 12.

10 Claims, 1 Drawing Sheet

DRIVER FOR AN EXTERNAL FET WITH HIGH ACCURACY AND GATE VOLTAGE PROTECTION

CROSS-REFERENCE TO RELATED APPLICATION

This application is a continuation of copending International Application No. PCT/EP01/14120, filed Dec. 3, 2001, which designated the United States and which was published in English.

BACKGROUND OF THE INVENTION

Field of the Invention

The invention relates to a regulator circuit comprising a driver circuit driving an external FET, and more particularly to improvements in power driver circuits for designing a linear regulator or charger.

A problem which occurs in technologies where Zener diodes are not available, is driving an external FET (field effect transistor). FETs are, for instance, used as current supply units in linear regulators or battery or accumulator chargers as well as in a vast field of other applications.

In most such implementations, it is necessary to protect the gate electrode of the FET from high voltages relative to the source electrode potential. Gate voltage limitation is a necessity when FETs with low threshold voltages are used, like in chargers for wireless applications (i.e. cellular or cordless phones etc.)

Beside the aspect of voltage limitation, it is desired that the current outputted by the FET is controllable with high accuracy. Therefore, the driving voltage for the FET is demanded to show a high degree of insensitivity to variations of the operating voltage, often denoted as line variations.

Further, a very low minimum FET output current should be available.

Typically, operational amplifiers (op-amps) are used for driving an external FET. Conventionally, the output stage of an op-amp is a transistor stage. In the past, voltage protection has been accomplished by adding an external clamping diode to the output of the op-amp or by using an op-amp with an output stage provided with an integrated Zener diode. These solutions, however, suffer from low accuracy due to the fact that their zero point or null voltage (voltage output at short-circuit input condition) is difficult to control. In order to design a regulator with low minimum output current, an external FET with very small transconductance and a driving op-amp with a very high gain are required. The corresponding specifications are difficult to meet.

SUMMARY OF THE INVENTION

It is accordingly an object of the invention to provide a regulator circuit for driving an external FET, which overcomes the above-mentioned disadvantages of the heretofore-known devices and methods of this general type and which provides for an improved regulator circuit comprising a driver circuit driving an external FET which is insensitive to line variations. In particular, the regulator circuit of the invention shall enable the implementation of a linear regulator with high accuracy and low minimum output current. More particularly, the circuit shall provide for an effective voltage limitation at the gate-source electrodes of the external FET.

With the foregoing and other objects in view there is provided, in accordance with the invention, a driver circuit for driving an external FET having gate and source electrodes and having a threshold voltage. The driver circuit comprising:

a differential amplification stage with a first input terminal and a second input terminal, the differential amplification stage including a first current flow path, a second current flow path, and a common constant current source commonly biasing the first and second current flow paths, and the differential amplification stage receiving an operating voltage defined by a first operating potential and a second operating potential;

an output load resistor connected in one of the first and second current flow paths, a current flowing through the one current flow path being controlled by a voltage between the first and second input terminals of the differential amplification stage and being substantially independent of variations of either the first operating potential or the second operating potential;

the output load resistor being connected between the gate and source electrodes of the external FET to be driven; and the output load resistor having a resistance value chosen to provide a voltage across the gate and source electrodes of the external FET near to or substantially equal to the threshold voltage of the FET when the first and second input terminals of the differential amplification stage are set to equal potential values.

In accordance with an advantageous feature of the invention, the driver circuit is implemented as a regulator circuit for driving the external FET. The FET to be driven, in a specific embodiment, is a PMOS FET.

In other words, the regulator circuit of the invention includes a driver circuit driving an external FET. The driver circuit comprises an differential amplification stage. The differential amplification stage comprises a common constant current source and a first and a second current flow path, both current flow paths being biased by the common constant current source. The differential amplification stage is supplied by an operating voltage defined by a first and a second operating potential. The output of the driver circuit according to the invention comprises an output load resistor included in one of the current flow paths, the current flowing through this current flow path being controlled by the voltage between the two input terminals of the differential amplification stage and being substantially independent of variations of either of the first or second operating potential. As the load resistor being connected between the gate and source electrodes of the external FET, line variations do not result in voltage variations across the gate and source electrodes of the external FET.

Further, the resistance value of the load resistor is chosen to provide a voltage across the gate and source electrodes of the external FET near or substantially equal to the threshold voltage of the external FET in case the potentials applied to the two input terminals of the differential amplification stage are set to the same value. Then, the null point of the circuit is set to match with the optimal low current operating condition of the external FET. This increases the accuracy of the linear regulator at very low source-drain currents of the external FET.

In accordance with an added feature of the invention, the first and second current flow paths include a differential transistor pair with control electrodes respectively connected to the first and second input terminals. Preferably, the transistors of the transistor pair are bipolar transistors.

In accordance with an additional feature of the invention, the output load resistor has a first terminal connected to a first operating potential. There is also provided, in accordance with another feature of the invention, a transistor with a collector electrode connected in the one current flow path (the current path with the output load resistor). The output load resistor, in this embodiment, has a second terminal connected to the collector electrode of the transistor. Preferably, the source electrode of the FET is connected to the first operating potential, and the second terminal of the output load resistor is connected to the gate electrode of the FET.

In accordance with a further feature of the invention, the transistor pair has two transistors each with an emitter electrode commonly connected to a first common terminal of the constant current source; and the constant current source has a second terminal connected to the second operating potential.

In accordance with a specifically advantageous feature of the invention, the first and second current flow paths are provided with a differential transistor pair the control electrodes of which are connected to the first and second input terminals, respectively, and the current flow path which includes the load resistor being either the first or the second current flow path of the differential amplification stage. In this embodiment, the load resistor is simply located in one of the flow paths of the differential amplification stage. Thus, the common constant current source feeding the differential amplification stage simultaneously supplies the current flowing through the load resistor. As the maximum current flowing through one of the first or second current flow paths of the differential amplification stage is limited by the current outputted by the common constant current source, a built-in limitation of the voltage across the load resistor is achieved.

Preferably, the regulator circuit for driving an external FET is an operational amplifier, in which the differential amplification stage and the load resistor constitute the output stage of the operational amplifier. In accordance with an advantageous feature of the invention, there is provided a feedback circuit connecting an output of the operational amplifier to an input of the operational amplifier.

In a preferred implementation of the invention, the driver circuit forms the regulator circuit of a battery charger or accumulator charger.

Other features which are considered as characteristic for the invention are set forth in the appended claims.

Although the invention is illustrated and described herein as embodied in a driver for an external FET with high accuracy and gate voltage protection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
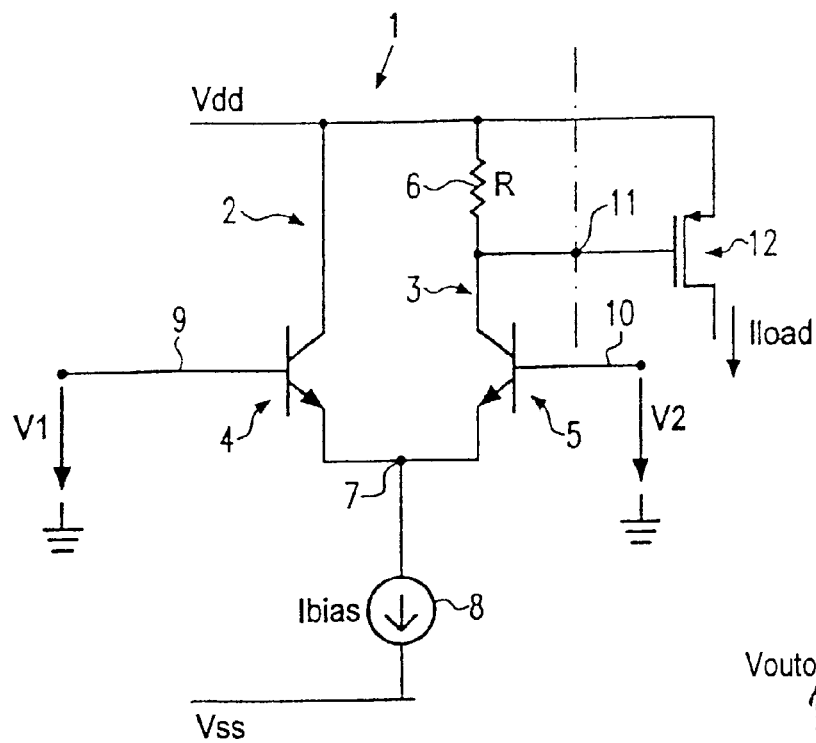
FIG. 1 is a schematic circuit diagram of a circuit in accordance with a preferred embodiment of the invention.

Referring now to the figures of the drawing in detail and first, particularly, to FIG. 1 thereof, there is shown a schematic of an embodiment of the circuit for driving an external FET. The driver circuit 1 has two current flow paths 2 and 3. The current path 2 includes a first bipolar npn transistor 4 and the second current path 3 includes a second npn tranistor 5 connected in series with a load resistor 6.

The emitters of the first and second transistors 4 and 5 are connected to a common node 7.

A constant current source 8 is connected between an operating potential Vss and the common node 7 to source a current Ibias to the two current flow paths 2 and 3. On the other hand, the collector of the first transistor 4 and a first terminal of the load resistor 6 are connected to another operating potential Vdd. The second terminal of the load resistor 6 opposite to the first resistor terminal is connected to the collector of the second transistor 5.

The constant current source 8, the transistor pair 4 and 5, and the load resistor 6 may be implemented in an integrated circuit (IC) which is driven by the operating voltage Vdd-Vss.

Input terminals of the driver circuit 1 are represented by lines 9 and 10. They are connected to the respective base of the transistors 4 and 5.

An output terminal of the driver circuit 1 is identified with the reference numeral 11. The output terminal 11 is connected with the second current flow path 3 at a point thereof between the collector of the second transistor 5 and the load resistor 6.

The external FET to be controlled by the driver circuit 1 is identified by reference numeral 12. In the configuration shown in FIG. 1, the FET 12 is a PMOS FET. The source of the FET 12 is connected to Vdd and the gate of the FET 12 is connected to the output terminal 11. The dash-dotted line represents the boundary of the IC comprising the driver circuit 1.

The driver circuit 1 and the FET 12 establish a linear regulator. The output of the regulator is represented by the drain of the FET 12. This linear regulator, for instance, may be a battery or accumulator charger. In this case, the battery or accumulator to be charged is fed by the drain current Iload of the FET 12.

As will be explained below, the driver circuit 1 preferably constitutes the output stage of an op-amp. In contrast, a conventional op-amp, which is used to control an external FET in a battery or accumulator charger, uses a transistor output amplification stage as an output stage. However, the output stage of the circuit according to FIG. 1 is a differential pair equipped with the load resistor 6, which is preferably realized by a low ohmic polysilicon resistor.

In operation, the constant current source 8, which is controled by a bandgap voltage, biases the two transistors 4, 5 by the total current Ibias. Like the bandgap voltage, the current Ibias is independent of temperature and parametric variations.

First, considering the voltage limitation aspect of the driver circuit 1, the maximum voltage drop that may occur across the load resistor 6 is R*Ibias, where R denotes the resistance of the load resistor 6. Thus, irrespective of the input voltages at lines 9 and 10, the maximum voltage between the gate and the source of the FET 12 is limited to this specific value. Therefore, in the event of an over-voltage appearing at the source of the FET 12 (for instance due to a sudden increase in Vdd), the potential at the gate of the FET 12 is automatically pulled up. This protects the FET 12 from being damaged, provided that R*Ibias has a sufficiently small value, for instance 1.5 to 2.0 volts. This, of course, can be guaranteed by a suitable choice of R in relation to Ibias.

A further advantage of the driver circuit 1, compared to a conventional transistor output stage of an operational amplifier, is that it is insensitive to line variations, i.e. variations of the operating potentials Vdd or Vss. When a variation of Vdd or Vss occurs, the current flows through both branches 2 and 3 of the input amplification stage remain constant, because the currents depend only on the voltage difference $\Delta V = V1 - V2$ between the voltages V1 and V2 inputted into the differential amplification stage at lines 9 and 10, respectively. This implies that the voltage across the load resistor 6 remains constant without requiring a variation of input voltages V1 or V2 for balancing line variations. In fact, no systematic error occurs due to line variations, thus maintaining the external PMOS FET 12 always properly biased.

Still further, the driver circuit 1 fulfills the high accuracy requirements imposed on regulators for the generation of very low source-drain currents.

For explanation, assume that the two input terminals 9 and 10 are interconnected. In this case, the driver circuit 1 will have a DC output voltage Vnp at 11 relative to ground. Vnp is denoted by the expression null point or null voltage. It is noted, that the existence of a null point unequal to zero is a fundamental characteristic of the driver circuit 1 and even exists with ideal transistors 4 and 5. In case of ideal transistors 4 and 5, the null voltage amounts to $Vnp = Vdd - R*Ibias/2$.

Figure 2:
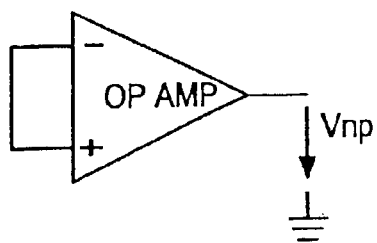
FIG. 2 is a simplified block diagram for explanation of the zero point of an op-amp.

Preferably, the driver circuit 1 represents the output stage of an op-amp. In the following, the differential input voltage of an op-amp is denoted by Vinop-amp and the output voltage of the op-amp with respect to ground is denoted as Voutop-amp. FIG. 2 is a simplified block diagram for explanation of the null point of an op-amp. Analogously, the null point Vnp of an op-amp is the output voltage with respect to ground in case that the differential input terminals of the op-amp are short-circuited (Vinop-amp=0). As the ground is usually given by the mean of the operating potentials (this is also the case for an asymmetric or even unipolar operating voltage), the null point is the offset of the op-amp. Conventionally, the offset of an op-amp is usually adjusted to zero, i.e., the op-amp is "nulled," in order to provide for full differential amplification of the input differential voltage.

Figure 4:
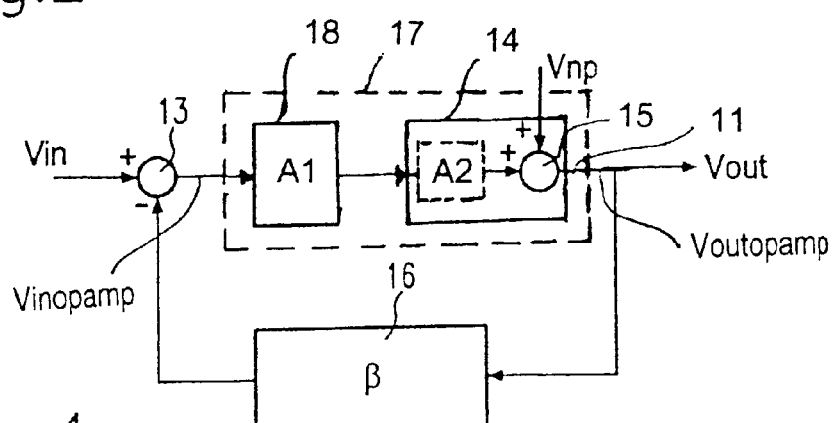
FIG. 4 is a schematic block diagram of a negative feedback control network applied to an op-amp with a null point different from zero.

FIG. 4 is a general schematic block diagram of a negative feedback amplifier control network for the case of a null point output voltage Vnp which may be unequal to zero.

The input of this circuit is realized by a voltage Vin connected to a non-inverting input of a subtracter 13. An op-amp 17 provides for an open circuit voltage gain A. The output of the op-amp 17, multiplied by the feedback factor β of the feedback network 16, is negatively fed back to the op-amp 17 via the inverting input of the subtracter 13.

The op-amp 17 is composed of an input amplification stage 18 and an output amplification stage 14. A1 is the amplification of the input amplification stage 18 and A2 is the amplification of the output amplification stage 14. The gain, therefore, is A=A1*A2.

The output amplification stage 14 may have a null point Vnp different from zero. This is illustrated by an adder 15 located at the output of the output amplification stage 14 and adding a specific null point voltage Vnp to the output of the op-amp (at this moment, it is assumed that the input amplification stage 18 is fully differential). Thus, the system shown in FIG. 4 is a negative feedback op-amp amplifier with variable null point Vnp.

First, let us assume the conventional case, i.e. an op-amp 17 with Vnp=0 is used in such closed loop system with a negative feedback network. Then, according to conventional basic control theory, the output voltage of the network Vout (which is identical to the output voltage Voutop-amp of the op-amp 17) is given by the expression $$Vout = A*Vin/(1+A*\beta)$$

Conventional basic control theory always assumes that the null point is set to zero. Therefore, in order to achieve a certain output voltage different from zero, a certain amount of voltage between the input terminals of the op-amp is required. This required voltage difference is reflected to the output voltage as a systematic error $$Ess = Vinop\text{-}amp/\beta.$$

Now, consider an op-amp 17 with an output amplification stage 14 corresponding to the driver circuit 1 as shown in FIG. 1 (without FET 12). In other words, the output amplification stage 14 with amplification A2 and adder 15 generating null point Vnp is the equivalent circuit for the driver circuit 1 (without FET 12). Again, the input amplification stage 18 is completely differential, i.e. Vnp represents also the null point of the op-amp 17.

Figure 3:
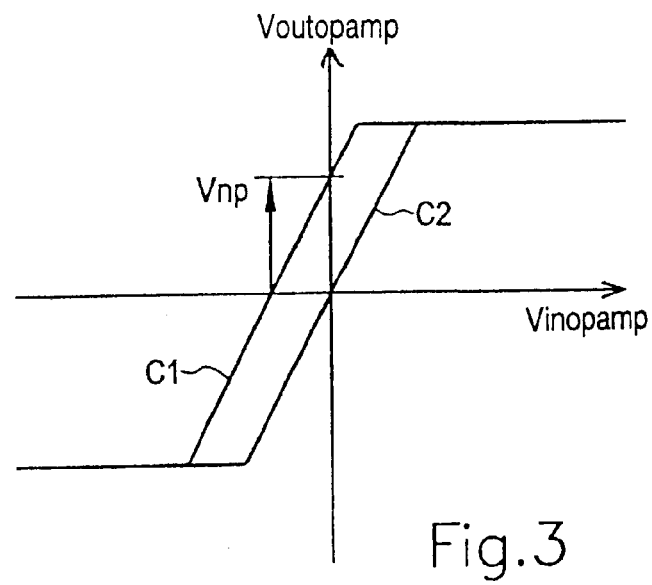
FIG. 3 is a plot of the output voltage of an op-amp comprising the circuit shown in FIG. 1 as an output stage and the output voltage of a conventional op-amp versus the differential input voltage thereof, respectively.

FIG. 3 is a pictorial representation of the output voltage Voutop-amp of an op-amp (without feedback loop) versus the differential input voltage Vinop-amp of an op-amp. Curve C1 is the output voltage Voutop-amp of the op-amp 17 being equipped with the circuit of FIG. 1 as an output amplification stage 14 thereof. In other words, curve C1 displays the voltage at terminal 11 of circuit 1. Curve C2 is the output voltage Voutop-amp of an exemplary zero null point op-amp 17. The output voltage Voutop-amp is shown on the y-axis and the differential input voltage Vinop-amp is shown on the x-axis. As apparent from FIG. 3, curve C1 intersects the y-axis at Vnp different to zero, whereas the curve C2 intersects the y-axis at zero output voltage. The slopes of the curves C1 and C2 are given by the open circuit voltage gains A of the respective op-amps, which, in this example, are chosen to be equal.

Returning once more to FIG. 4, the output voltage of the negative feedback system as shown in FIG. 4 becomes $$Vout = (Vnp + A*Vin)/(1+A*\beta)$$

For large values of A, Vout≈Vin/β. This is equivalent to the usual case when using an op-amp as amplification stage 17 with zero null point voltage (Vnp=0).

The steady state error at the output of this system is given by the equation $$Ess = (Vin - \beta*Vnp)/(\beta + \beta^2*A)$$

According to the above equation, in case of Vnp=Vin/β, the steady state error Ess becomes zero independent of the open circuit gain A. On the other hand, as already mentioned, Vin/β≈Vout for large values of A. Therefore, by setting the null point near to the desired output voltage, the Vinop-amp required becomes very small thereby causing a much smaller systematic error at the output than in the conventional case.

Using a fully differential input amplification stage 18 for the op-amp 17, the null point of the op-amp 17 is given by the null point of the circuit 1, namely Vnp=Vdd−R*(Ibias/2). This null point is set near to the threshold voltage $V_T$ of the external PMOS FET 12. This can be achieved by choosing appropriate values for R and/or Ibias. Then, the PMOS FET 12 is driven near its threshold value, and the transconductance of the PMOS FET 12 is very low for low output currents of the PMOS FET 12, where most accuracy is needed. Thus, at low load current demands, a voltage near the threshold voltage at the gate of the external PMOS is supplied, and this implies that the output voltage and external null point is near the desired value.

As the load current increases, so will the transconductance of the PMOS FET 12, therefore the open loop gain will increase and the accuracy will remain in specification even for high load currents.

To resume, the circuit 1 allows to limit the maximum gate source voltage on the external PMOS FET 12 and does not generate systematic offset error due to line voltage variations. Further, by setting the null point of the driver circuit 1 to a desired value, the accuracy, especially at very low load currents, is increased.

We claim:

1. A regulator circuit, comprising:
    an integrated circuit operational amplifier forming a driver circuit for driving a FET being external to said integrated circuit and having gate and source electrodes and having a threshold voltage, the operational amplifier including:
        a differential amplification stage with a first input terminal and a second input terminal, said differential amplification stage including a first current flow path, a second current flow path, and a common constant current source commonly biasing said first and second current flow paths, and said differential amplification stage receiving an operating voltage defined by a first operating potential and a second operating potential;
        an output load resistor connected in one of said first and second current flow paths, a current flowing through said one current flow path being controlled by a voltage between said first and second input terminals of said differential amplification stage and being substantially independent of variations of either the first operating potential or the second operating potential;
        a feedback circuit connecting an output of the operational amplifier to an input of the operational amplifier;
        said output load resistor being connected between the gate and source electrodes of the external FET to be driven;
        said differential amplification stage and said output load resistor forming an output stage of the operational amplifier;
        said output load resistor having a resistance value chosen to provide a voltage across the gate and source electrodes of the external FET near to or substantially equal to the threshold voltage of the external FET when said first and second input terminals of said differential amplification stage are set to equal potential values.

2. In a battery charger or accumulator charger, a regulator circuit, comprising:
    an integrated circuit operational amplifier forming a driver circuit for driving a FET being external to said integrated circuit and having gate and source electrodes and having a threshold voltage, the operational amplifier including:
        a differential amplification stage with a first input terminal and a second input terminal, said differential amplification stage including a first current flow path, a second current flow path, and a common constant current source commonly biasing said first and second current flow paths, and said differential amplification stage receiving an operating voltage defined by a first operating potential and a second operating potential;
        an output load resistor connected in one of said first and second current flow paths, a current flowing through said one current flow path being controlled by a voltage between said first and second input terminals of said differential amplification stage and being substantially independent of variations of either the first operating potential or the second operating potential;
        a feedback circuit connecting an output of the operational amplifier to an input of the operational amplifier;
        said output load resistor being connected between the gate and source electrodes of the external FET to be driven;
        said differential amplification stage and said output load resistor forming an output stage of the operational amplifier;
        said output load resistor having a resistance value chosen to provide a voltage across the gate and source electrodes of the external FET near to or substantially equal to the threshold voltage of the external FET when said first and second input terminals of said differential amplification stage are set to equal potential values.

3. An integrated circuit operational amplifier forming a driver circuit for driving a FET being external to said integrated circuit and having gate and source electrodes and having a threshold voltage, the operational amplifier comprising:
    a differential amplification stage with a first input terminal and a second input terminal, said differential amplification stage including a first current flow path, a second current flow path, and a common constant current source commonly biasing said first and second current flow paths, and said differential amplification stage receiving an operating voltage defined by a first operating potential and a second operating potential;
    an output load resistor connected in one of said first and second current flow paths, a current flowing through said one current flow path being controlled by a voltage between said first and second input terminals of said differential amplification stage and being substantially independent of variations of either the first operating potential or the second operating potential;
    a feedback circuit connecting an output of the operational amplifier to an input of the operational amplifier;
    said output load resistor being connected between the gate and source electrodes of the external FET to be driven;
    said differential amplification stage and said output load resistor forming an output stage of the operational amplifier;

said output load resistor having a resistance value chosen to provide a voltage across the gate and source electrodes of the external FET near to or substantially equal to the threshold voltage of the external FET when said first and second input terminals of said differential amplification stage are set to equal potential values.

4. The operational amplifier according to claim 3, wherein said first and second current flow paths include a differential transistor pair with control electrodes respectively connected to said first and second input terminals.

5. The operational amplifier according to claim 4, wherein the transistors of said transistor pair are bipolar transistors.

6. The operational amplifier according to claim 3, wherein said output load resistor has a first terminal connected to a first operating potential.

7. The operational amplifier according to claim 6, which comprises a transistor with a collector electrode connected in said one current flow path with said output load resistor, and wherein said output load resistor has a second terminal connected to said collector electrode of said transistor.

8. The operational amplifier according to claim 7, wherein:

the source electrode of the FET is connected to the first operating potential; and said second terminal of said output load resistor is connected to the gate electrode of the FET.

9. The operational amplifier according to claim 3, wherein the FET to be driven is a PMOS FET.

10. The operational amplifier according to claim 4, wherein:

said transistor pair has two transistors each with an emitter electrode commonly connected to a first common terminal of said constant current source; and said constant current source has a second terminal connected to the second operating potential.

* * * * *